United States Patent
Wang

(10) Patent No.: US 11,342,030 B1
(45) Date of Patent: May 24, 2022

(54) ERASE VOLTAGE COMPENSATION MECHANISM FOR GROUP ERASE MODE WITH BIT LINE LEAKAGE DETECTION METHOD

(71) Applicant: ELITE SEMICONDUCTOR MICROELECTRONICS TECHNOLOGY INC., Hsinchu (TW)

(72) Inventor: Ming-Xun Wang, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 17/145,415

(22) Filed: Jan. 11, 2021

(51) Int. Cl.
*G11C 16/20* (2006.01)
*G11C 16/16* (2006.01)
*G11C 16/34* (2006.01)

(52) U.S. Cl.
CPC .......... *G11C 16/16* (2013.01); *G11C 16/3404* (2013.01); *G11C 16/344* (2013.01); *G11C 16/345* (2013.01); *G11C 16/3409* (2013.01)

(58) Field of Classification Search
CPC ........................... G11C 16/16; G11C 16/3409
See application file for complete search history.

(56) References Cited

U.S. PATENT DOCUMENTS

| | | | |
|---|---|---|---|
| 6,515,910 B1* | 2/2003 | Lee | G11C 16/3409 365/185.29 |
| 7,020,021 B1* | 3/2006 | Leung | G11C 11/5635 365/185.19 |
| 9,449,698 B1* | 9/2016 | Paudel | G11C 16/14 |
| 9,830,963 B1* | 11/2017 | Pang | G11C 7/062 |
| 10,580,505 B1 | 3/2020 | Chen | |
| 2001/0053095 A1* | 12/2001 | Jinbo | G11C 16/3468 365/185.25 |
| 2008/0117691 A1* | 5/2008 | Kawasaki | G11C 16/16 365/185.33 |
| 2015/0270004 A1* | 9/2015 | Tsai | G11C 16/3445 365/185.11 |

FOREIGN PATENT DOCUMENTS

CN  105144300 A  12/2015

* cited by examiner

*Primary Examiner* — Mushfique Siddique

(57) ABSTRACT

An erase voltage compensation mechanism for group erase mode with bit line leakage detection comprises performing a block erase operation by applying an erase voltage. Continue block erasing until bit line leakage is detected upon which the erase voltage is latched and over-erase correction is performed. A compensation voltage value is calculated by finding the difference between an upper bound of a threshold voltage distribution and an erase verify point when the bit line leakage was detected. The latched erase voltage is increased by the compensation voltage to create a compensated voltage. A group erase operation is performed and the group address is incremented by 1 and the compensated voltage value is loaded. Then the group erase operation is performed on the next group. The address is incremented, the compensated voltage is loaded, and the group erase operation is performed until the group is the last group.

16 Claims, 6 Drawing Sheets

ERASE VOLTAGE COMPENSATION MECHANISM FOR GROUP ERASE MODE WITH BIT LINE LEAKAGE DETECTION METHOD

BACKGROUND OF THE INVENTION

1. Field of the Invention

The present disclosure relates to erase voltage compensation, and in particular to an erase voltage compensation mechanism for group erase mode with bit line leakage detection method.

2. Description of the Related Art

Flash memory consists of transistor memory cells which have sources, drains, floating gates and control gates. The transistor memory cells are programmed to store a binary 1 or a binary 0 by applying voltages to the control gates. The programming procedure includes erasing and then reading the transistor memory cells and then verifying that the memory cell is erased.

In conventional flash memory, the drains of the transistor memory cells are connected to bit lines. Unfortunately, if too many memory cells are drawing background leakage current, the cell read current can be exceeded and the state of the memory cell cannot be read. As a result, the flash memory is rendered not functional.

The current erase operations can be divided into pre-programmed, erase, over-erase correction (OEC), and post over-erase correction (POEC). For block erase, the erase voltage is first applied to a whole block. After one shot of erase, the leakage current of the bit line is detected to determine whether to change the erase region or not. If bit line leakage (BL leak) is not detected, the next shot of erase voltage is applied to the whole block. Once bit line leakage is found, the OEC is executed to repair over-erased cells. After that, the operation is switched to group erase mode, which means the erase region is changed from a whole block to a group, whose size is smaller than a block (ex. 1 sector, 2 sectors, etc.) to reduce probability of over-erasing.

Refer to FIG. 1, which is a flowchart illustrating a method of operation flow performed on flash memory of the prior art.

The conventional method 10 starts with pre-programming the flash memory cells in Step 20. In Step 30 the flash cells are erased. An over-erase correction process is performed in Step 40 and a post over-erase correction process is performed in Step 50.

The erase operation (Step 30) includes a series of steps. In Step 31, for block erase, the erase voltage is first applied to a whole block. Then bit line leakage (BL leak) detection is performed in Step 32. If no bit line leakage is detected, the method 10 returns to Step 31 for the block erase operation. Once bit line leakage is detected, the OEC is executed to repair over-erased cells in Step 33. In Step 34, the method is switched to group erase mode, which means the erase region is changed from a whole block to a group, to reduce risk or probability of over-erasing.

After each group erase operation in Step 34, it is determined whether or not the group is the last group of the block to be erased in Step 35. If the group is not the last group, the method returns to perform the group erase operation on the next group in Step 34. When the group is the last group of the block, which means that the erase step of the block is finished, the method is done in Step 36.

Refer to FIG. 2, which is a graph illustrating early bit line leakage detection and the resulting effect on the relationship between threshold voltage distribution and the erase verify (EV) point.

For advanced processes, flash cells exhibit the characteristic of wide threshold voltage distribution. As shown in FIG. 2, when bit line leakage is detected too early, the upper bound of threshold voltage distribution is still far away from the EV point, which means that the block erase switches to group erase mode too early. Therefore, many groups of the block take a long time to erase them to the EV point, resulting in long block erase times.

Therefore, to overcome the disadvantages of the prior art, there is need for an improved erase voltage compensation mechanism for group erase mode with bit line leakage detection method.

BRIEF SUMMARY OF THE INVENTION

An objective of the present disclosure is to provide a voltage compensation mechanism for group erase mode.

The present invention provides a voltage compensation mechanism for group mode. To utilize the compensation mechanism, the compensation voltage must be determined.

To accomplish this, the bit line leakage detection point, the erase verify point, and the threshold voltage distribution are determined. Since the erase ability is proportional to the erase voltage, the difference between an upper bound of the threshold voltage (Vt) distribution and the erase verify (EV) point is calculated to determine the compensation voltage (Vcomp) when the lower bound of the Vt distribution reaches the leakage detection point, as shown in FIG. 3.

For example, assume the bit line leakage detection point=−0.1 volt, the EV point=4 volts, and the Vt distribution=5 volts, then Vcomp can be calculated to be 0.9 volts.

When bit line leakage is detected, the erase voltage is increased by Vcomp to enhance the erase ability during group erase mode. Therefore, the block erase time can be improved due to the compensated erase speed for every group.

The erase operation applies positive and negative voltages on the P-well (PW) and the word line (WL) of flash cells, respectively. The positive voltage will ramp up to a higher level when the shot number of the current voltage step runs out. Notably, the erase voltage while entering group erase mode is recorded as the initial erase voltage for every group. Therefore, the erase ability can be enhanced by increasing positive voltage or negative voltage, as described below.

If it is determined to compensate erase voltage by increased positive voltage: When the erase operation is switched to group erase mode, the initial positive high voltage for every group is increased by Vcomp.

If it is determined to compensate erase voltage by increased negative voltage: When the erase operation is switched to group erase mode, the initial negative high voltage for every group is compensated by Vcomp.

The present invention provides an erase voltage compensation method comprising detecting bit line leakage, detecting a current erase voltage, calculating a compensation voltage, increasing the current erase voltage by the compensation voltage to obtain a compensated voltage, using the compensated voltage, and performing a group erase operation by applying the compensated voltage as the initial erase voltage until a last group is reached.

The present invention also provides an erase voltage compensation method comprising performing a block erase operation until bit line leakage is detected; latching a current erase voltage; determining a compensation voltage value; increasing the latched erase voltage by the compensation voltage value to obtain a compensated voltage; performing a group erase operation on a group; incrementing an address of the group by 1; loading the compensated voltage; and performing a group erase operation on a next group.

In an embodiment, the method of the present invention further comprises incrementing the address, loading the compensated voltage, and performing the group erase operation until the group is a last group. In an embodiment, the method of the present invention increases a positive high voltage for every group by the compensation voltage value. In an embodiment, the method of the present invention increases a negative high voltage for every group by the compensation voltage value. In an embodiment, the method of the present invention applies positive and negative voltages on a P-well (PW) and a word line (WL) of flash cells, respectively, for the block erase operation and the group erase operation. In an embodiment, the method of the present invention ramps up the positive voltage to a higher level when the shot number of the current voltage step runs out.

In an embodiment, the method of the present invention further comprises performing an over-erase correction operation when bit line leakage is detected. In an embodiment the erase voltage is first applied to a whole block during the block erase operation.

In an embodiment, the compensation voltage value equals a difference between an upper bound of a threshold voltage distribution and an erase verify point. In order to determine the compensation voltage value, a bit line leakage detection voltage point, an erase verify point, and a threshold voltage distribution are determined, and then a difference between an upper bound of the threshold voltage distribution and the erase verify point is calculated to determine the compensation voltage value.

In an embodiment, the present invention provides an erase voltage compensation mechanism for group erase mode with bit line leakage detection comprising: performing a block erase operation by applying an erase voltage; determining whether or not bit line leakage has been detected; if bit line leakage has not been detected, continuing the block erase operation; when bit line leakage is detected, latching the current erase voltage; performing over-erase correction; determining a compensation voltage value; increasing the latched erase voltage by the compensation voltage value to obtain a compensated voltage value; switching to group erase mode; performing a group erase operation; after each group erase operation, determining whether or not a group is a last group to be erased; if the group is not the last group, incrementing an address of the group by 1; loading the compensated voltage value; performing the group erase operation on a next group; and incrementing the address, loading the compensated voltage, and performing the group erase operation until the group is a last group.

In embodiments, a positive high voltage for every group is increased by the compensation voltage value; a negative high voltage for every group is increased by the compensation voltage value; the block erase operation and the group erase operation apply positive and negative voltages on a P-well (PW) and a word line (WL) of flash cells, respectively; the positive voltage ramps up to a higher level when a shot number of a current voltage step runs out; during the block erase operation the erase voltage is applied to a whole block; the compensation voltage value equals a difference between an upper bound of a threshold voltage distribution and an erase verify point; and in order to determine the compensation voltage value, a bit line leakage detection voltage point, an erase verify point, and a threshold voltage distribution are determined, and then a difference between an upper bound of the threshold voltage distribution and the erase verify point is calculated to determine the compensation voltage value.

In an embodiment, the present invention provides an erase voltage compensation mechanism for group erase mode with bit line leakage detection comprising: performing a block erase operation by applying an erase voltage to a whole block; determining whether or not bit line leakage has been detected; if bit line leakage has not been detected, continuing the block erase operation; when bit line leakage is detected, latching the erase voltage; performing over-erase correction; determining a compensation voltage value by calculating a difference between an upper bound of a threshold voltage distribution and an erase verify point when the bit line leakage was detected; increasing the latched erase voltage by the compensation voltage value to obtain a compensated voltage value; switching to group erase mode; performing a group erase operation; after each group erase operation, determining whether or not a group is a last group to be erased; if the group is not the last group, incrementing an address of the group by 1; loading the compensated voltage value; performing the group erase operation on a next group; and incrementing the address, loading the compensated voltage, and performing the group erase operation until the group is a last group.

In embodiments, an initial positive high voltage for every group is increased by the compensation voltage value; an initial negative high voltage for every group is increased by the compensation voltage value; the block erase operation and the group erase operation apply positive and negative voltages on a P-well (PW) and a word line (WL) of flash cells, respectively; the positive voltage ramps up to a higher level when a shot number of a current voltage step runs out.

DETAILED DESCRIPTION OF THE INVENTION

To facilitate understanding of the object, characteristics and effects of this present disclosure, embodiments together with the attached drawings for the detailed description of the present disclosure are provided.

Figure 1:
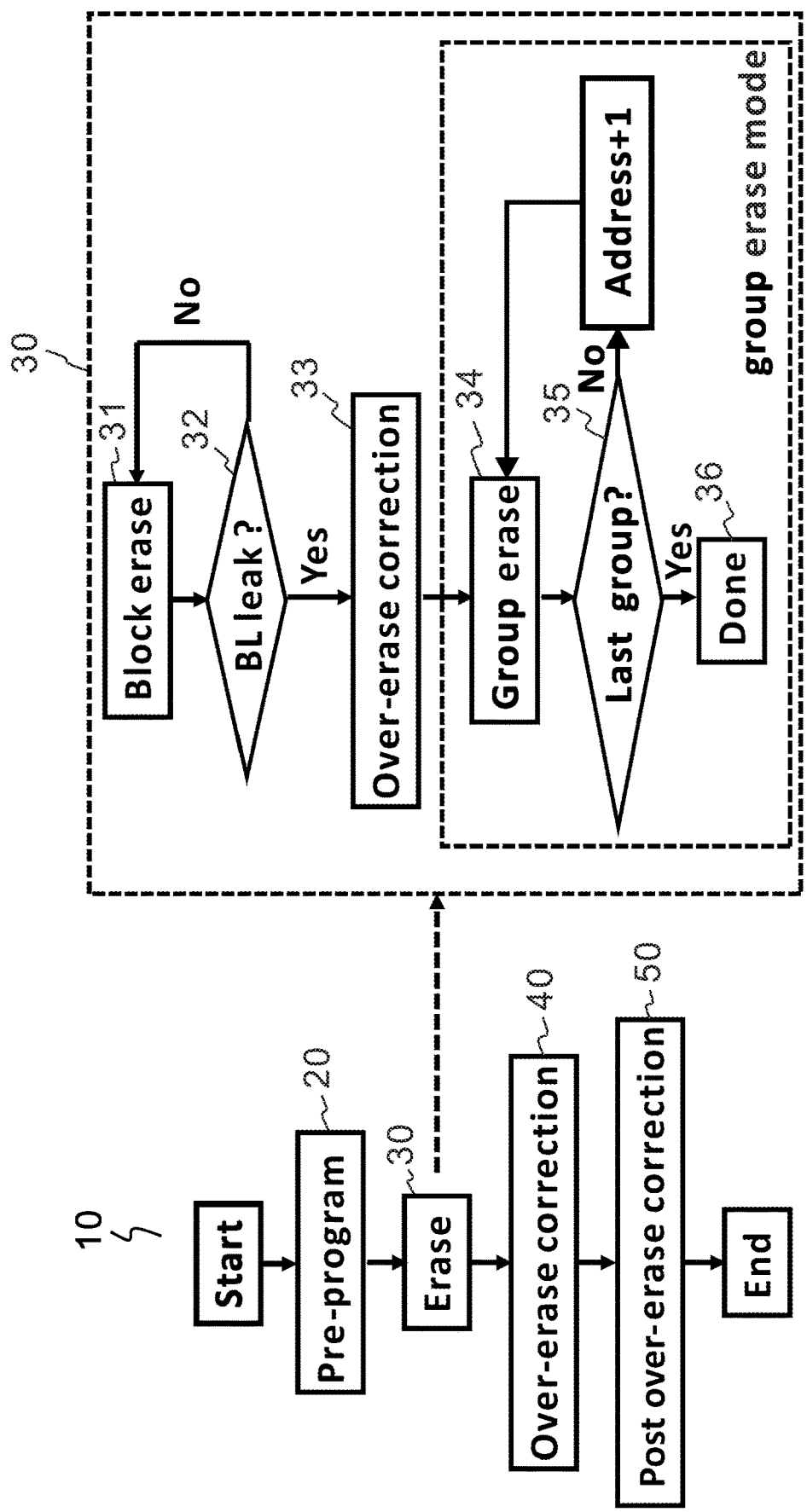
FIG. 1 is a flowchart illustrating a method of operation flow performed on flash memory of the prior art.
Figure 2:
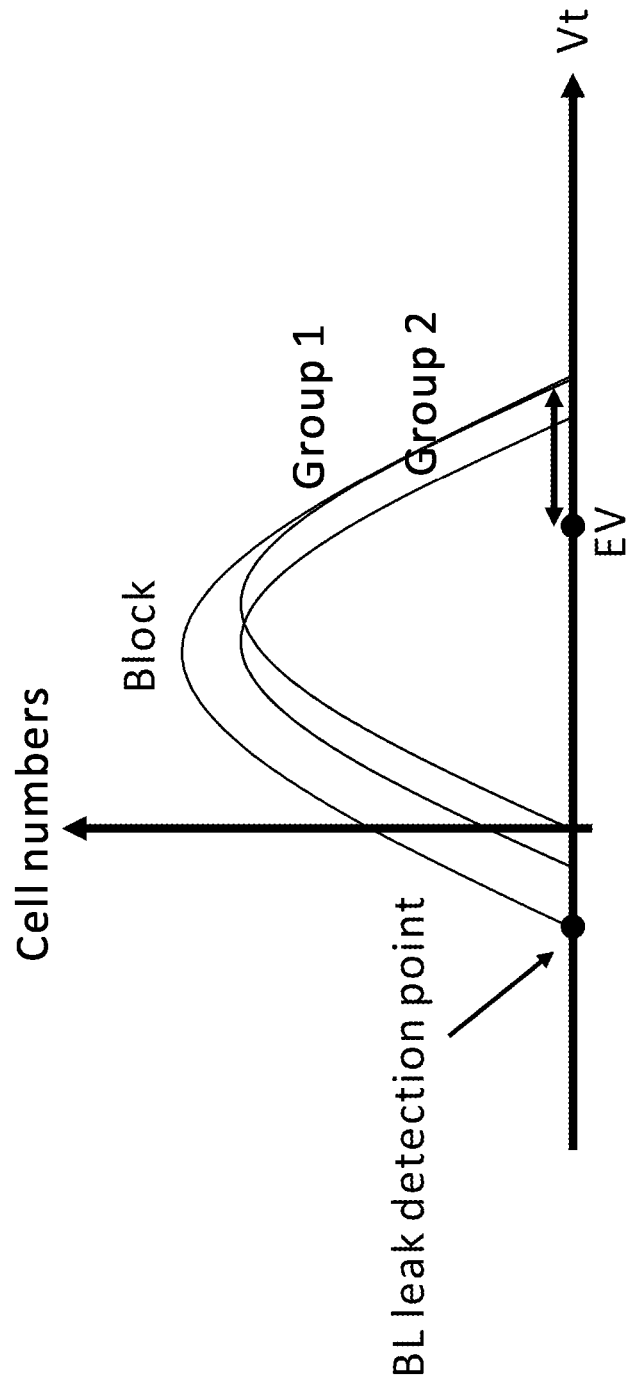
FIG. 2 (prior art) is a graph illustrating early bit line leakage detection and the resulting effect on the relationship between threshold voltage distribution and the erase verify (EV) point.
Figure 3:
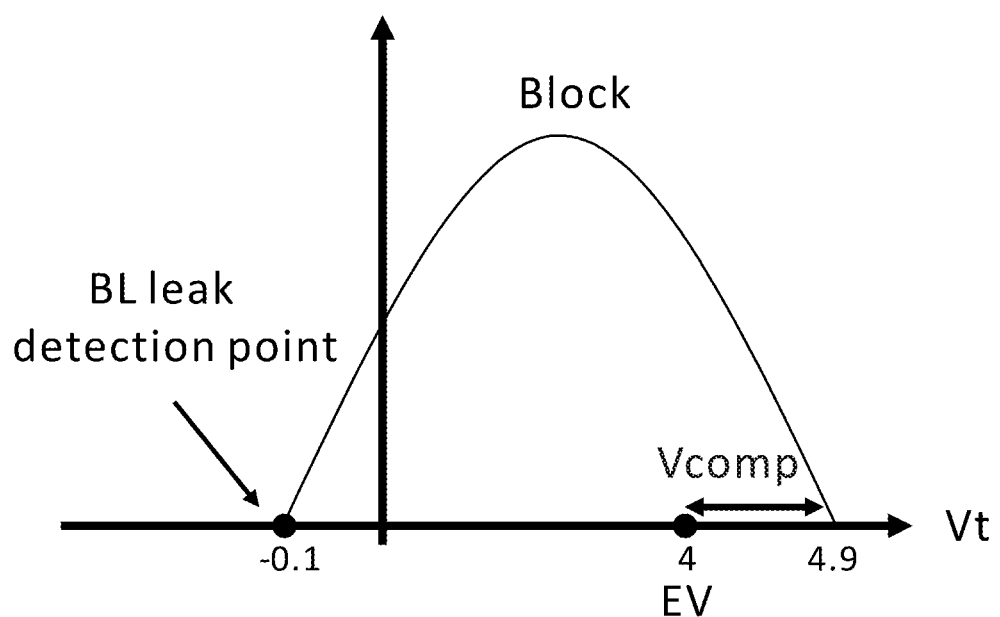
FIG. 3 is a graph illustrating a method of determining compensation voltage for a voltage compensation mechanism for group erase mode according to an embodiment of the present invention.

Refer to FIG. 3, which is a graph illustrating a method of determining compensation voltage for a voltage compensation mechanism for group erase mode according to an embodiment of the present invention.

The present invention provides a voltage compensation mechanism for group erase mode. To utilize the compensation mechanism, the compensation voltage must be determined.

To accomplish this, the bit line leakage detection point voltage, the erase verify point, and the threshold voltage distribution are determined. Then, when the lower bond of threshold voltage (Vt) distribution reaches the bit line leakage detection point, the difference between the upper bound of Vt distribution and the erase verify (EV) point is calculated to determine the compensation voltage (Vcomp).

In the example illustrated in FIG. 3, assume the bit line leakage detection point=−0.1 volt, the EV=4 volts, and the Vt distribution=5 volts, then Vcomp can be calculated to be 0.9 volts.

Figure 4:
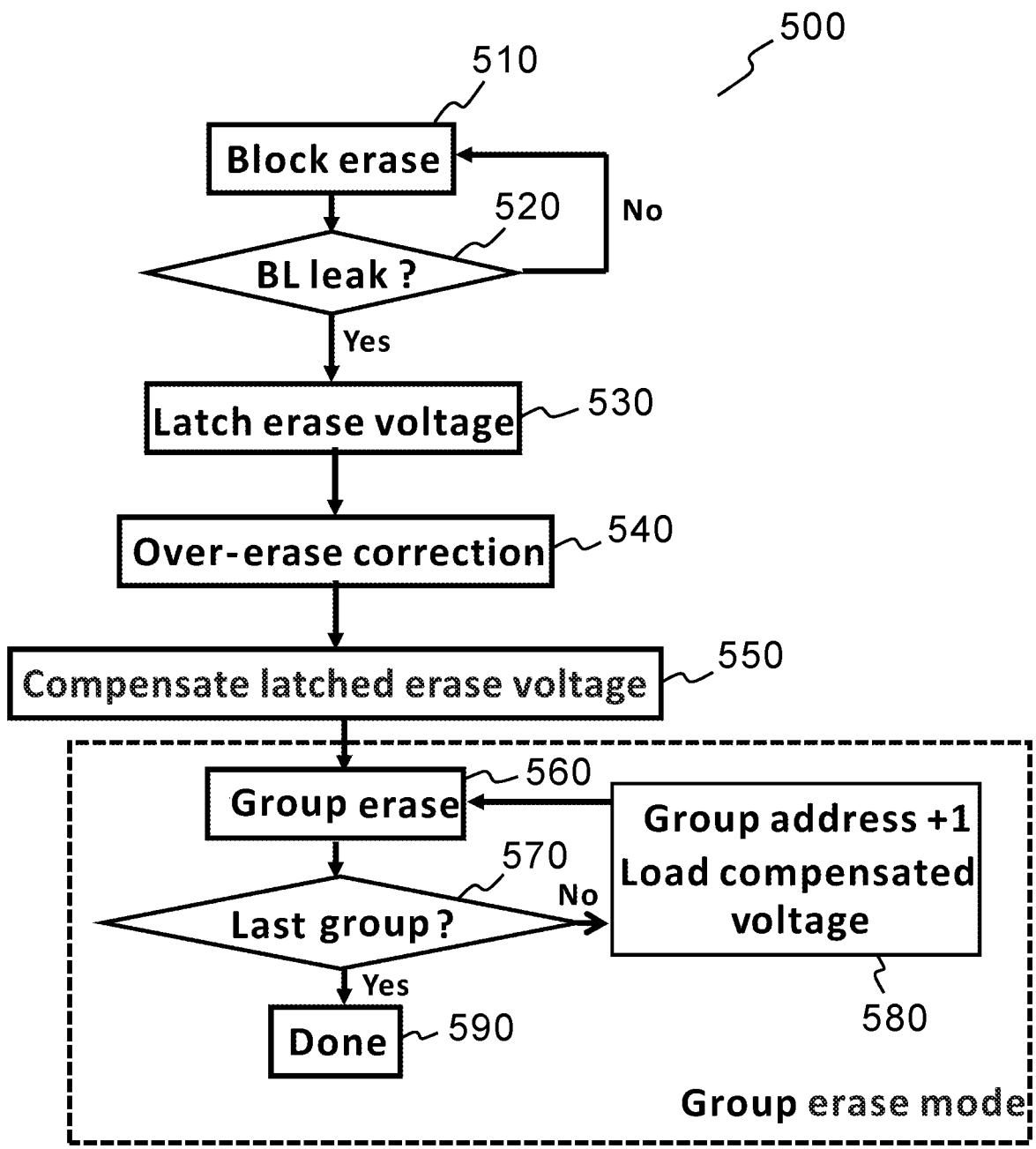
FIG. 4 is a flowchart illustrating an erase voltage compensation mechanism for group erase mode with bit line leakage detection method.

Refer to FIG. 4, which is a flowchart illustrating an erase voltage compensation mechanism for group erase mode with bit line leakage detection method.

When bit line leakage is detected, the erase voltage is increased by Vcomp to enhance the erase ability during group erase mode. Therefore, the block erase time can be improved due to the compensated erase speed for every group.

As shown in FIG. 4, the erase voltage compensation mechanism for group erase mode with bit line leakage detection method 500 comprises a block erase operation in Step 510. During block erase the initial erase voltage is applied to the whole block. In Step 520, determine whether or not bit line leakage has been detected. If bit line leakage has not been detected, the method returns to Step 510 and continues the block erase operation. When bit line leakage is detected in Step 520, the erase voltage is latched in Step 530, and over-erase correction is performed in Step 540. When bit line leakage is detected, the erase voltage is increased by Vcomp. In order to determine the voltage value of Vcomp, the bit line leakage detection point voltage, the EV, and the Vt distribution are determined. Then the difference between the threshold voltage (Vt) distribution and the erase verify (EV) point is calculated to determine the compensation voltage (Vcomp).

When the value of Vcomp is determined, the latched erase voltage is increased by Vcomp in Step 550. Increasing the erase voltage by Vcomp enhances the erase ability during group erase mode. As a result, the block erase time can be improved due to the compensated erase speed for every group.

After compensating the latched erase voltage in Step 550, the method switches to group erase mode. A group erase operation is performed in Step 560. After each group erase operation in Step 560, it is determined whether or not the group is the last group to be erased in Step 570. If the group is not the last group, the method increments the group address by 1 and loads the compensated voltage in Step 580, and returns to perform the group erase operation on the next group in Step 560. When the group is the last group, the method is done in Step 590.

Figure 5:
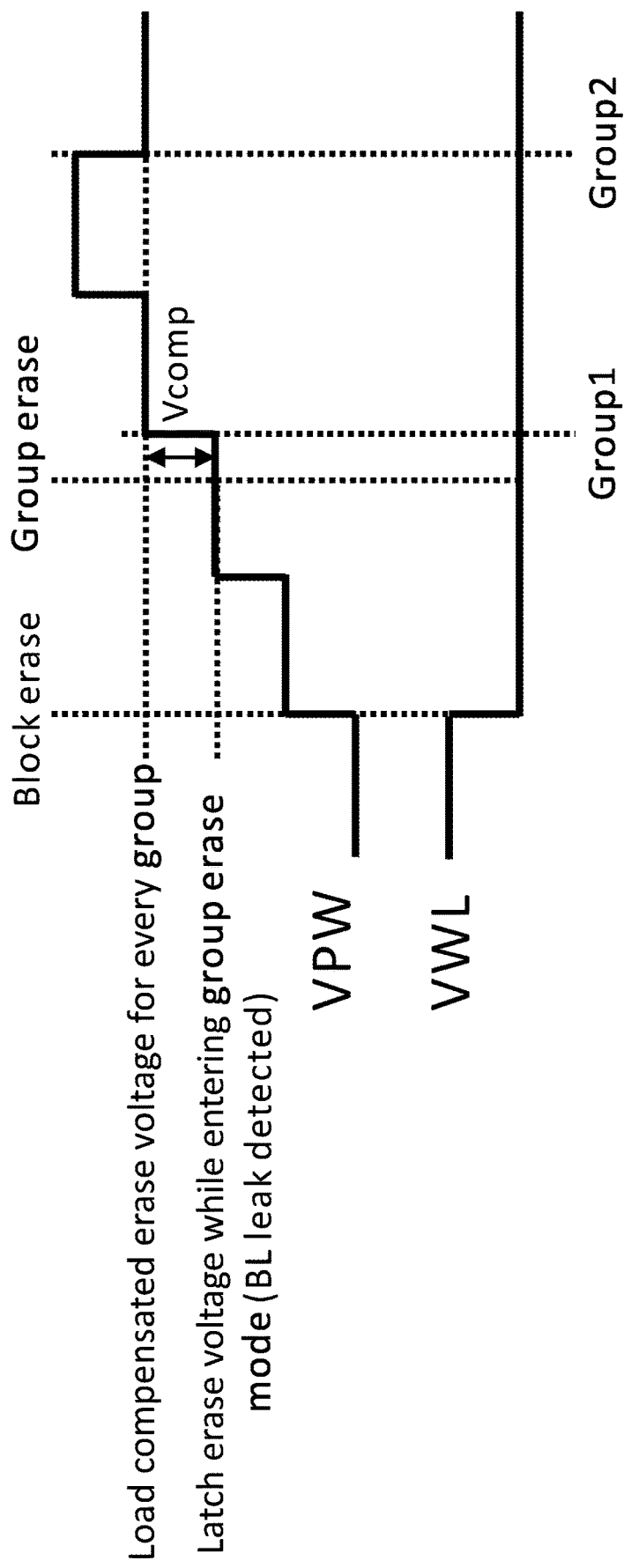
FIG. 5 is a drawing illustrating compensating the positive voltage according to an embodiment of the present invention.
Figure 6:
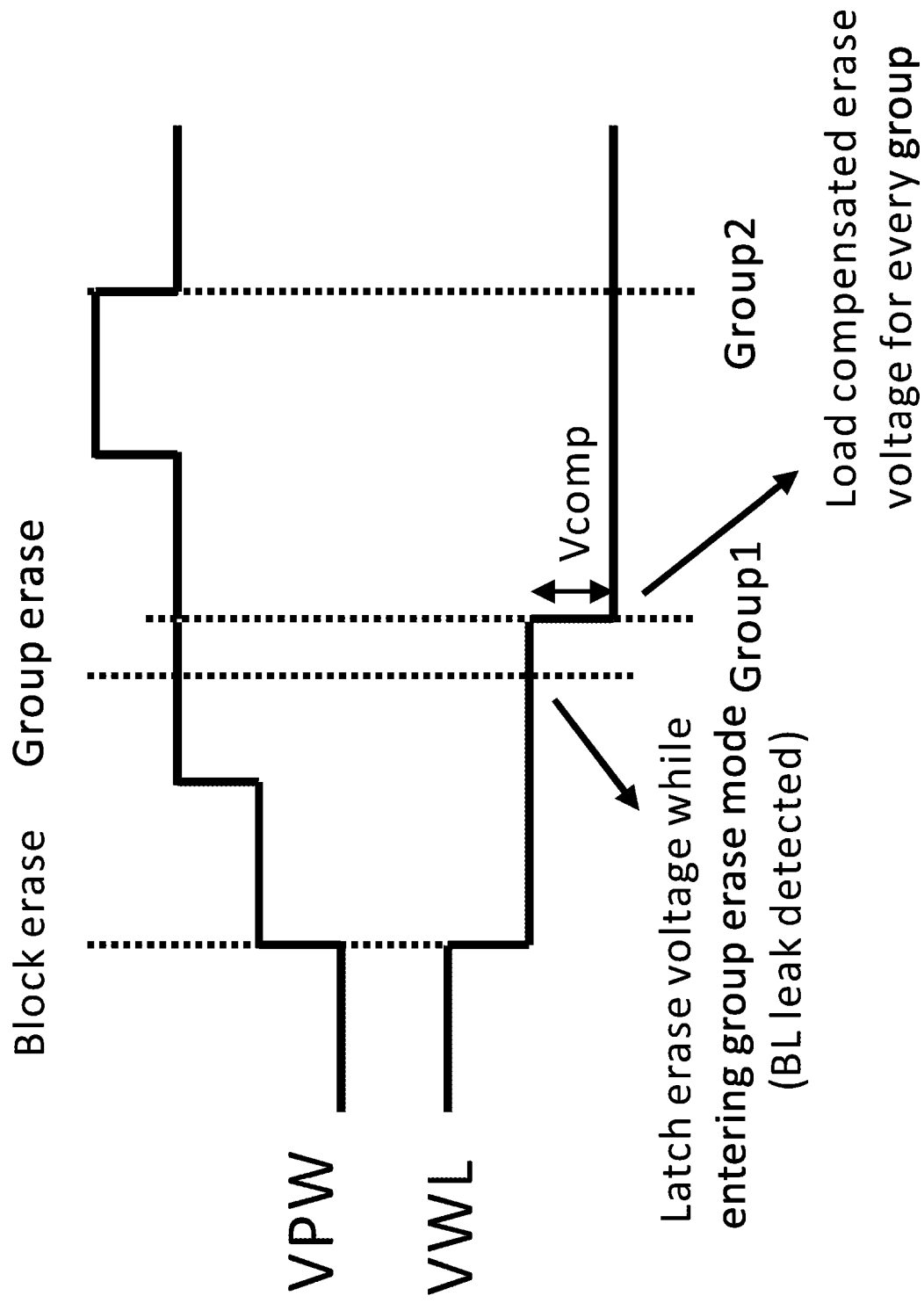
FIG. 6 is a drawing illustrating compensating the negative voltage according to an embodiment of the present invention.

Refer to FIG. 5, which is a drawing illustrating compensating the positive voltage according to an embodiment of the present invention and to FIG. 6, which is a drawing illustrating compensating the negative voltage according to an embodiment of the present invention.

The erase operation applies positive and negative voltages on the P-well (VPW) and the word line (VWL) of flash cells, respectively. The positive voltage will ramp up to a higher level when the shot number of the current voltage step runs out. Notably, the erase voltage while entering group erase mode is recorded as the initial erase voltage for every group. Therefore, the erase ability can be enhanced by increasing positive voltage or negative voltage, as described below.

As shown in FIG. 5, when bit line leakage is detected, the erase voltage is latched before entering the group erase mode. When the erase operation is switched to group erase mode, the initial positive high voltage for every group is increased by Vcomp. The compensated erase voltage is loaded for every group.

As shown in FIG. 6, when bit line leakage is detected, the erase voltage is latched before entering the group erase mode. When the erase operation is switched to group erase mode, the initial negative high voltage for every group is compensated by Vcomp. The compensated erase voltage is loaded for every group.

While the present disclosure has been described by means of specific embodiments, numerous modifications and variations could be made thereto by those skilled in the art without departing from the scope and spirit of the present disclosure set forth in the claims.

What is claimed is:

1. An erase voltage compensation method comprising:
   detecting bit line leakage;
   detecting a current erase voltage;
   calculating a compensation voltage;
   increasing the current erase voltage by the compensation voltage to obtain a compensated voltage; and
   performing a group erase operation by applying the compensated voltage as an initial erase voltage until a last group is reached;
      wherein a block erase operation and the group erase operation apply positive and negative voltages on a P-well (PW) and a word line (WL) of flash cells, respectively; and
      wherein the positive voltage ramps up to a higher level when a shot number of a current voltage step runs out.

2. The erase voltage compensation method according to claim 1, further comprising:
   incrementing group address by 1, loading the compensated voltage, and performing the group erase operation until a group is the last group.

3. The erase voltage compensation method according to claim 1, wherein a positive high voltage for every group is increased by the compensation voltage.

4. The erase voltage compensation method according to claim 1, wherein a negative high voltage for every group is increased by the compensation voltage.

5. The erase voltage compensation method according to claim 1, further comprising:
   performing over-erase correction when bit line leakage is detected.

6. The erase voltage compensation method according to claim 1, wherein during the block erase operation the erase voltage is applied to a whole block.

7. The erase voltage compensation method according to claim 1, wherein the compensation voltage equals a difference between an upper bound of a threshold voltage distribution and an erase verify point.

8. The erase voltage compensation method according to claim 1, wherein in order to determine the compensation voltage, a bit line leakage detection voltage point, an erase verify point, and a threshold voltage distribution are determined, and then a difference between an upper bound of the threshold voltage distribution and the erase verify point is calculated to determine the compensation voltage.

9. An erase voltage compensation method comprising:
performing a block erase operation until bit line leakage is detected;
latching an erase voltage;
determining a compensation voltage value;
increasing the latched erase voltage by the compensation voltage value to obtain a compensated voltage;
performing a group erase operation on a group;
incrementing an address of the group by 1;
loading the compensated voltage; and
performing a group erase operation on a next group;
  wherein the block erase operation and the group erase operation apply positive and negative voltages on a P-well (PW) and a word line (WL) of flash cells, respectively; and
  wherein the positive voltage ramps up to a higher level when a shot number of a current voltage step runs out.

10. The erase voltage compensation method according to claim 9, further comprising:
incrementing the address, loading the compensated voltage, and performing the group erase operation until the group is a last group.

11. The erase voltage compensation method according to claim 9, wherein an initial positive high voltage for every group is increased by the compensation voltage value.

12. The erase voltage compensation method according to claim 9, wherein an initial negative high voltage for every group is increased by the compensation voltage value.

13. The erase voltage compensation method according to claim 9, further comprising:
performing over-erase correction when bit line leakage is detected.

14. The erase voltage compensation method according to claim 9, wherein during the block erase operation the erase voltage is applied to a whole block.

15. The erase voltage compensation method according to claim 9, wherein the compensation voltage value equals a difference between an upper bound of a threshold voltage distribution and an erase verify point.

16. The erase voltage compensation method according to claim 9, wherein in order to determine the compensation voltage value, a bit line leakage detection voltage point, an erase verify point, and a threshold voltage distribution are determined, and then a difference between an upper bound of the threshold voltage distribution and the erase verify point is calculated to determine the compensation voltage value.

* * * * *